(12) United States Patent  (10) Patent No.: US 7,515,474 B2
Giduturi  (45) Date of Patent: Apr. 7, 2009

(54) STEP VOLTAGE GENERATOR

(75) Inventor: Hari R. Giduturi, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 77 days.

(21) Appl. No.: 11/240,812

(22) Filed: Sep. 30, 2005

(65) Prior Publication Data

US 2007/0076473 A1  Apr. 5, 2007

(51) Int. Cl.
G11C 11/34 (2006.01)
G11C 16/06 (2006.01)

(52) U.S. Cl. .......................... 365/185.23; 365/185.18; 365/185.03

(58) Field of Classification Search ............ 365/185.23, 365/185.18, 185.03
See application file for complete search history.

(56) References Cited

U.S. PATENT DOCUMENTS

| | | | | |
|---|---|---|---|---|
| 6,075,725 A | * | 6/2000 | Choi et al. ............... | 365/185.2 |
| 6,115,285 A | * | 9/2000 | Montanari et al. ...... | 365/185.03 |
| 6,137,726 A | * | 10/2000 | Choi et al. ............. | 365/185.24 |
| 6,777,918 B2 | * | 8/2004 | Harrington et al. .......... | 323/222 |
| 7,064,529 B2 | * | 6/2006 | Telecco ...................... | 323/267 |
| 7,313,019 B2 | * | 12/2007 | Giduturi et al. ........ | 365/185.03 |

OTHER PUBLICATIONS

U.S. Appl. No. 11/018,130, entitled "Step Voltage Generation," filed Dec. 21, 2004.
U.S. Appl. No. 11/000,317, entitled "Voltage Reference Apparatus, Method, and System," filed Nov. 30, 2004.

* cited by examiner

Primary Examiner—Hoai V Ho
Assistant Examiner—Kretelia Graham
(74) Attorney, Agent, or Firm—Trop, Pruner & Hu, P.C.

(57) ABSTRACT

A technique includes selectively coupling a regulator to storage elements to store voltages in the storage elements. In response to an operation to read data from a multilevel cell, a word line is selectively coupled to the storage elements to generate a time sequence of voltages on the word line.

14 Claims, 7 Drawing Sheets

STEP VOLTAGE GENERATOR

BACKGROUND

The invention generally relates to a step voltage generator.

Each cell of a multilevel cell (MLC) memory stores multiple bits of data. The cells may be flash cells, each of which is formed from a floating gate transistor. The floating gate transistor has a variable threshold voltage (called "$V_T$"), the level of which is programmed to one of multiple voltage levels for purposes of storing different values in the flash cell.

For example, the $V_T$ threshold may be programmed with four possible voltage levels, and thus, may indicate a two bit data value. The value that is programmed in the flash cell may be "read" by applying voltages to the gate terminal of the flash cell and observing the resulting current. Application of the $V_T$ threshold voltage to the gate terminal of the floating transistor produces a predictable current called the $V_T$ threshold current through the drain-source path of the transistor when the drain terminal of the transistor is set to a predetermined voltage level. For example, assume a $V_T$ threshold voltage called "$V_{T1}$" is programmed into the transistor and indicative of a particular data value. To determine whether this data value is stored by the flash cell, the $V_{T1}$ voltage may be applied to the gate terminal, and if the $V_{T1}$ voltage produces the $V_T$ threshold current, then the cell stores the particular data value.

Therefore, several different $V_T$ threshold voltages may be presented to the gate terminal of a flash cell for purposes of determining the data value that is stored by the cell. Due to the generation of the multiple, non-zero voltage levels, the circuitry that generates these voltage levels may be complex and consume a relatively large die area.

Thus, there is a continuing need for a circuit to generate multiple $V_T$ voltage levels for an MLC memory, which is relatively simple in design and consumes a relatively small die area.

DETAILED DESCRIPTION

Figure 1:
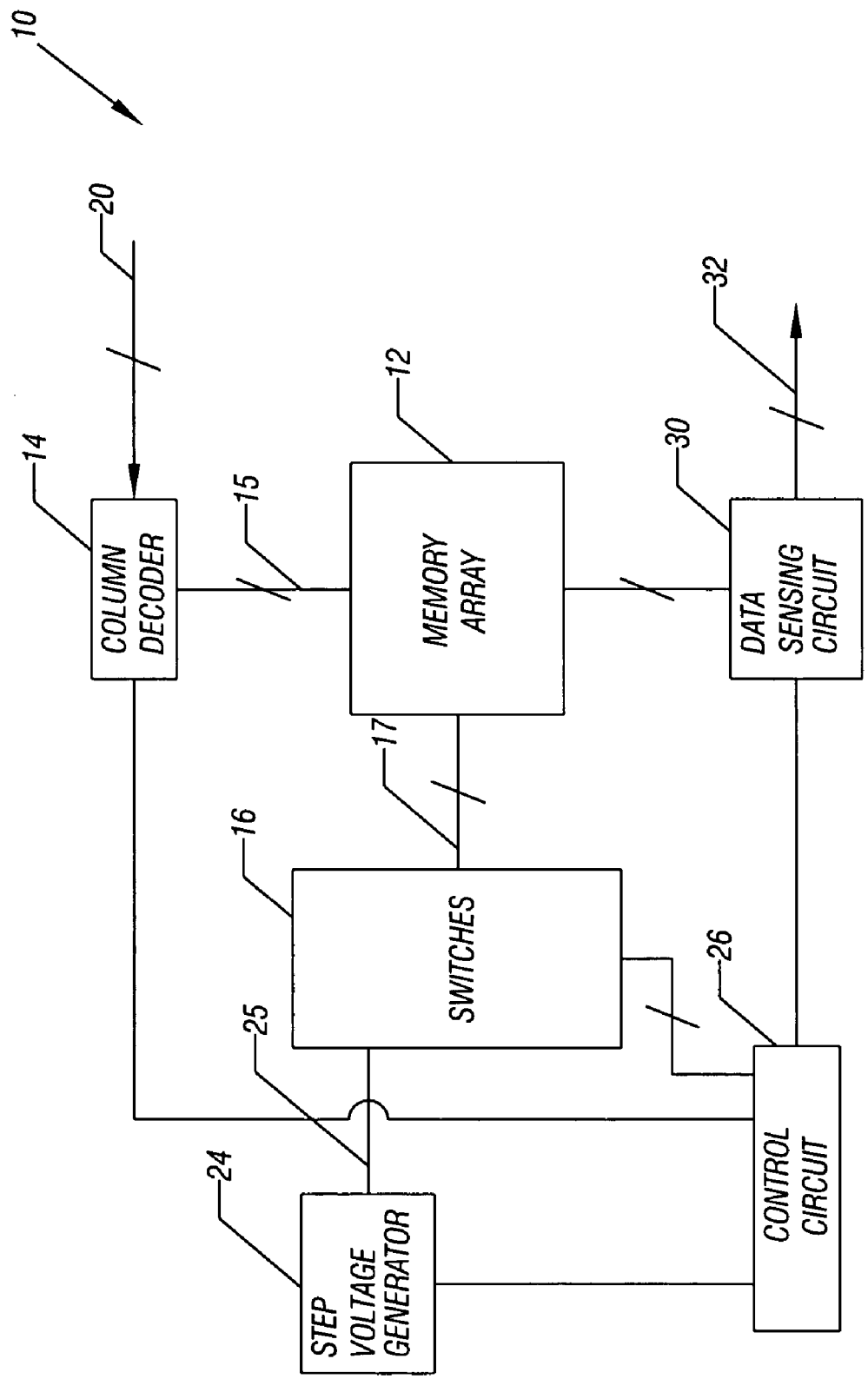
FIG. 1 is a block diagram of a memory that has an array of multilevel cells according to an embodiment of the invention.

Referring to FIG. 1, an embodiment of a multilevel cell (MLC) memory (a flash memory, for example) 10 in accordance with the invention includes an array 12 of MLCs. The memory 10 includes switches 16 and a column decoder 14 that activate word and column lines, respectively, to select one or more MLC(s) of the memory array 12 during a memory read operation.

Each MLC of the memory 12 stores a $V_T$ threshold voltage that is indicative of one of multiple bit data values. Thus, as a more specific example, each MLC may store one of four possible $V_T$ threshold voltages that indicate four possible bit states: 00b, 01b, 10b and 11b (wherein the suffix "b" indicates a binary representation).

During a read operation to sense the value stored by a particular MLC, a sequence of voltage levels (herein called a "time sequence") is applied to the gate terminal of the floating gate transistor of the MLC. By comparing the drain-to-source current of the transistor to a $V_T$ voltage threshold current (the current flowing through the drain-to-source path when the gate voltage is equal to the $V_T$ threshold voltage), a data sensing circuit 30 (of the memory 10), based on the timing of the time sequence, determines the bit value that is stored by the MLC. The time sequence is generated by a step voltage generator 24 whose output terminal is coupled to the switches 16 so that the switches 16 couple an output terminal 25 of the step generator 24 to the appropriate word line 17 during the read operation.

Figure 2:
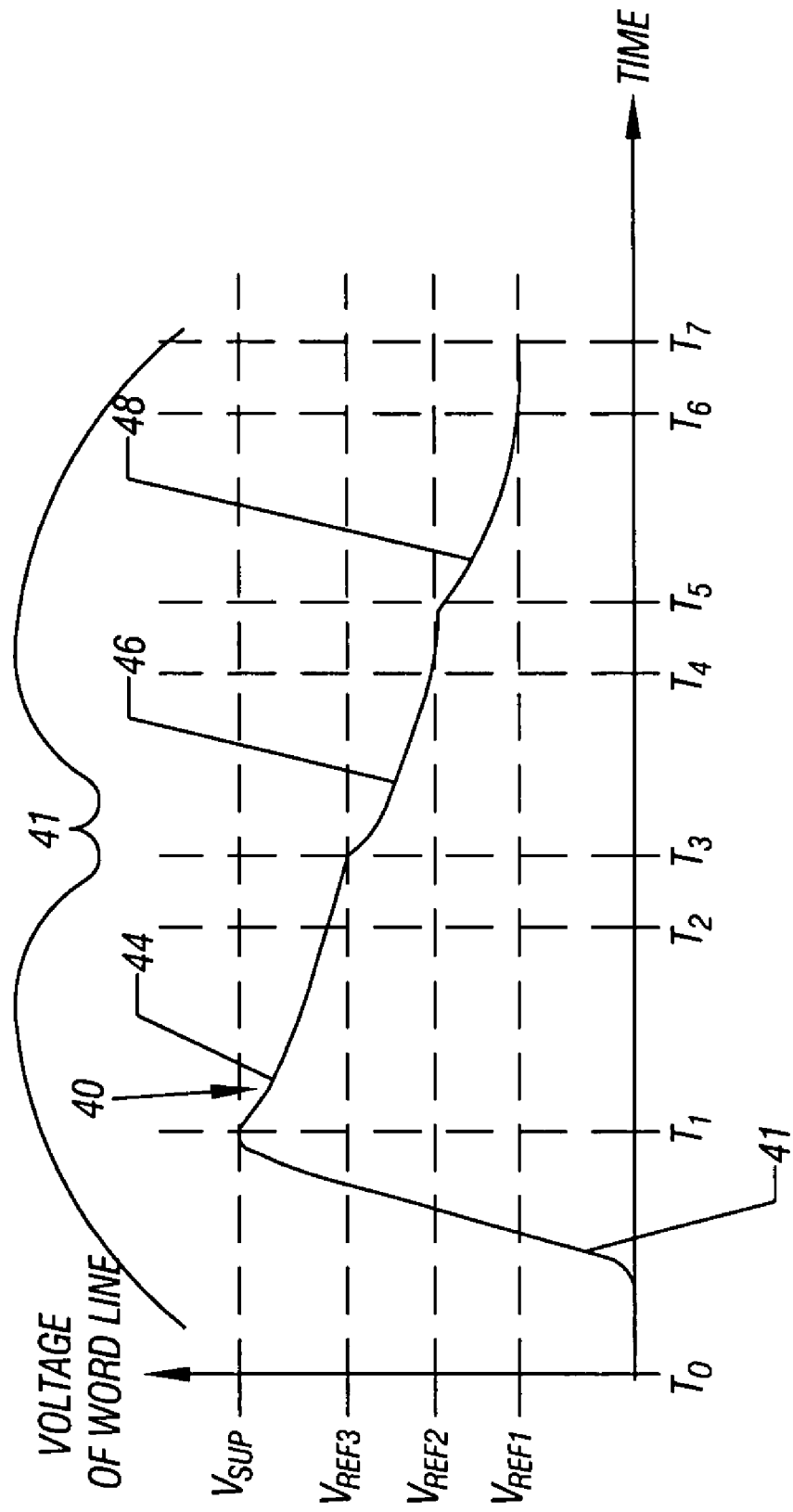
FIG. 2 is a waveform depicting a time sequence of a voltage that is applied to a gate terminal of a floating gate transistor of an MLC cell during a read operation according to an embodiment of the invention.

An exemplary time sequence 41 is depicted in FIG. 2. Referring to FIG. 2 in conjunction with FIG. 1, in the time sequence 41, the step generator 24 produces a voltage 40 on the word line 17 in which the voltage 40 transitions between different possible $V_T$ threshold voltages that may be stored on the MLC being read. The word line 17 is connected (by the switches 16) to the gate terminal of the floating transistor of the MLC. Therefore, the voltage 40 appears on the gate terminal of the floating gate transistor. The data sensing circuit 30 monitors the drain-to-source current produced through the floating gate transistor during the time sequence 41 to determine the bit value that is stored in the MLC. As depicted in FIG. 2, in the time sequence 41, the voltage 40 has different voltage levels (such as $V_{REF3}$, $V_{REF2}$ and $V_{REF1}$ voltage levels that appear in time segments 44, 46 and 48, respectively, as examples).

Referring back to FIG. 1, among the other components of the memory 10, in some embodiments of the invention, the memory 10 may include a control circuit 26 that is coupled to the above-described components of the memory 10 for purposes of controlling the step generator 24 to generate the time sequence 41 and for purpose of generally coordinating the above-described actions of the memory 10 during read and write operations. It is noted that FIG. 1 depicts a simplified version of the memory 10 for purposes of illustrating certain aspects of the memory 10 in accordance with some embodiments of the invention. However, it is noted that depending on the particular embodiment of the invention, the memory 10 may have other and/or different components.

Figure 3:
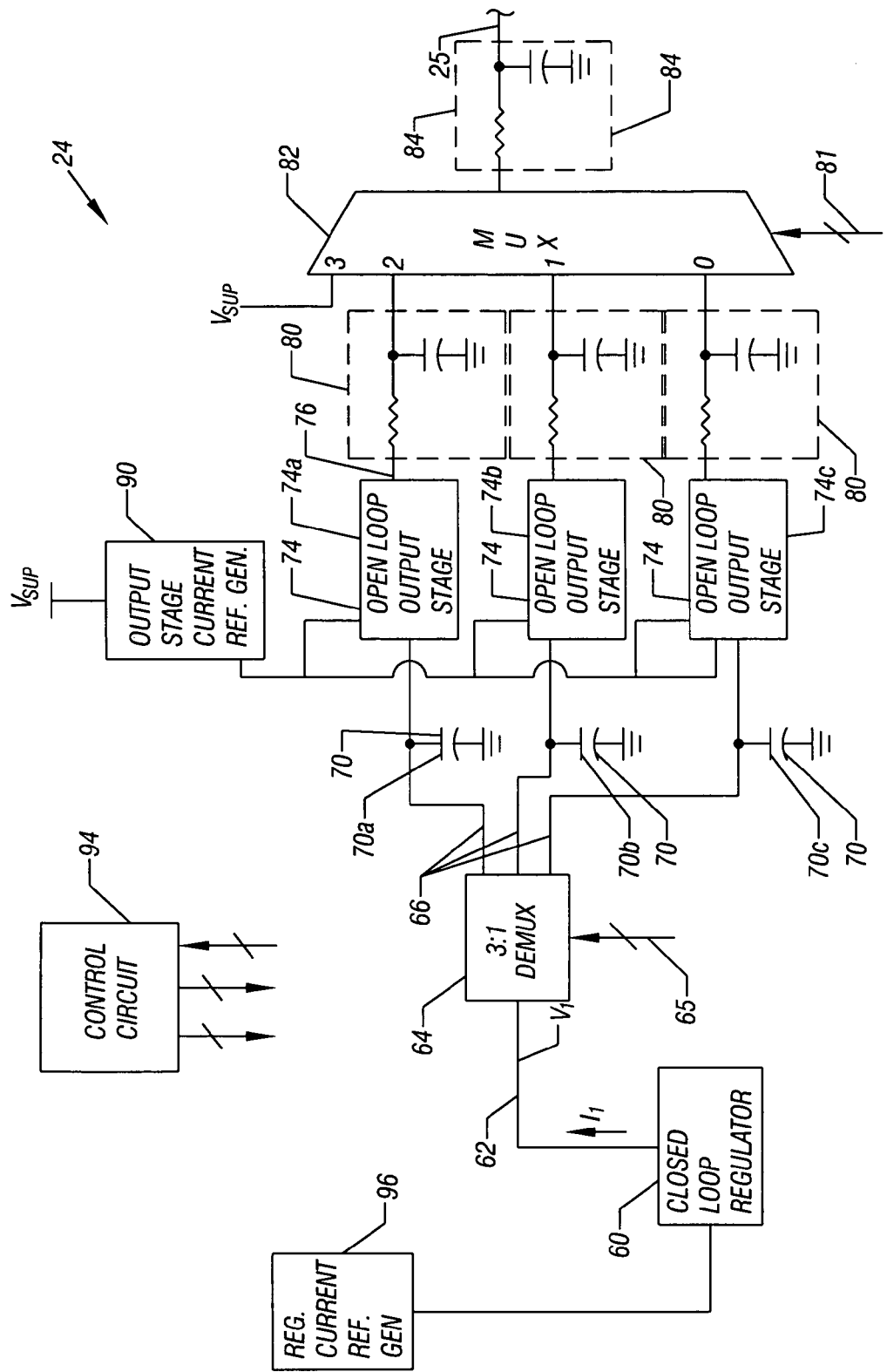
FIG. 3 is a schematic diagram of the step generator of the memory of FIG. 1 according to an embodiment of the invention.

Referring to FIG. 3, in accordance with some embodiments of the invention, the step generator 24 includes storage elements to store voltages so that the step generator 24 may use the stored voltages to generate the time sequence 41 (see FIG. 2). More specifically, in accordance with some embodiments of the invention, the step generator 24 includes capacitors 70a, 70b and 70c (referred to in general using the reference numeral "70") that store the $V_{REF3}$, $V_{REF2}$, and $V_{REF1}$ voltage levels, respectively. A multiplexer 82 (of the step generator 24) individually and selectively connects the appropriate capacitor 70 to the output terminal 25 of the step generator 24 at the appropriate time to generate the time sequence 41. The multiplexer 82 is controlled by a control input bus 81 that is coupled to the select terminals of the multiplexer 82.

More particularly, as depicted in FIG. 3, in some embodiments of the invention, the step generator 24 includes open loop output stages 74 (open loop output stages 74a, 74b and 74c, depicted as examples), each of which is associated with and coupled to one of the capacitors 70. Therefore, for the exemplary embodiment of the step generator 24 that is depicted in FIG. 3, the open loop output stage 74a is coupled to the storage element 70a; the open loop output stage 74b is coupled to the capacitor 70b; and the open loop output stage 74c is coupled to the capacitor 70c. Therefore, due to this arrangement, during the appropriate time segment of the time sequence 41 (FIG. 2), the multiplexer 82 couples an output terminal 76 of one of the open loop output stages 74 to the output terminal 25 of the step generator 24.

For example, referring to FIG. 2 in conjunction with FIG. 3, in some embodiments of the invention, during the time $T_0$ to time $T_1$ interval, the multiplexer 82 couples the output terminal 25 to the $V_{SUP}$ voltage supply. During time $T_1$ to time $T_3$, the multiplexer 82 couples the output terminal 76 of the open loop output stage 74a to the output terminal. Subsequently, during the time interval from time $T_3$ to time $T_5$, the multiplexer 82 couples the output terminal 76 of the open loop output stage 74b to the output terminal 25. Lastly, pursuant to the time sequence 41, from time $T_5$ to time $T_7$, the multiplexer 82 couples the output terminal 76 of the open loop output stage 74c to the output terminal 25. In some embodiments of the invention, at the conclusion of the time sequence 41, the multiplexer 82 grounds the output terminal 25. In other embodiments of the invention, the multiplexer 82 couples the output terminal 25 to the $V_{SUP}$ supply line at the conclusion of the time sequence. Thus, many variations are possible and are within the scope of the appended claims.

The step generator 25 stores the $V_{REF3}$, $V_{REF2}$ and $V_{REF1}$ voltage levels on the capacitors 70 using a closed loop regulator 60. More specifically, the step regulator 24 couples the closed loop regulator 60 to the capacitors 70 one at a time to bring the voltage of each capacitor 70 up to the appropriate level.

The closed loop regulator 60 provides an output voltage (called "$V_1$") that appears on an output terminal 62 of the regulator 60. A demultiplexer 64 (controlled by signals that appear at control terminals 65) of the step voltage generator 24 selectively couples the output terminal 62 of the closed loop regulator 60 to the capacitors 70 one at a time for purposes of storing the appropriate voltages on the capacitors 70. Thus, for example, the demultiplexer 64 may couple the output terminal 62 to the capacitor 70a (to store the $V_{REF3}$ voltage level), then to the capacitor 70b (to store the $V_{REF2}$ voltage level) and then to the capacitor 70c (to store the $V_{REF1}$ voltage level). The storage of the voltage on a particular capacitor occurs during a time in which the capacitor 70 may/may not be coupled to the output terminal 25.

The closed loop regulator 60, in some embodiments of the invention, supplies a charging current (called "$I_1$") through its output terminal 62 for purposes of charging the capacitor 70 to which the regulator 60 is connected until the capacitor 70 reaches the appropriate voltage level. For example, the closed loop regulator 60, in some embodiments of the invention, supplies the $I_1$ charging current to the capacitor 70a, until the voltage across the capacitor reaches the $V_{REF3}$ voltage. Similarly, the closed loop regulator 60 provides the $I_1$ charging current to the capacitor 70b until the voltage across the capacitor 70b reaches the $V_{REF2}$ voltage. Likewise, the closed loop regulator 60 provides the $I_1$ charging current to the capacitor 70c until the capacitor 70c reaches the $V_{REF1}$ voltage. Thus, the closed loop regulator 60 adjusts its output voltage regulation set point (as described below) depending on the particular capacitor 70 to which the regulator 60 is coupled.

Among the other features of the step generator 24, in some embodiments of the invention, the open loop output stages 74 are coupled to an output stage current reference generator 90 for purposes of generating a reference current in each of the stages 74, as further described below. The step generator 24 also includes a regulator current reference generator 96 that is coupled to the closed loop regulator 60 for purposes of generating a reference current in the regulator 60. In some embodiments of the invention, the step generator 24 also includes a control circuit 94 for purposes of coordinating the storage of the voltages on the capacitor 70 as well as the coupling of the open loop output stages 74 to the capacitor 70 during the generation of the time sequence 41 (FIG. 2) on the word line 17. Additionally, the step generator may include low pass filters 80 and 84 that are coupled to the input and output terminals, respectively, of the multiplexer 82. In some embodiments of the invention, the blocks 90 and 96 may be combined into one. The low pass filters 80 and 84 may be formed from explicit resistors and capacitors; or alternatively, in other embodiments of the invention, the low pass filters 80 and 84 may be formed from parasitic capacitances and resistances.

Figure 4:
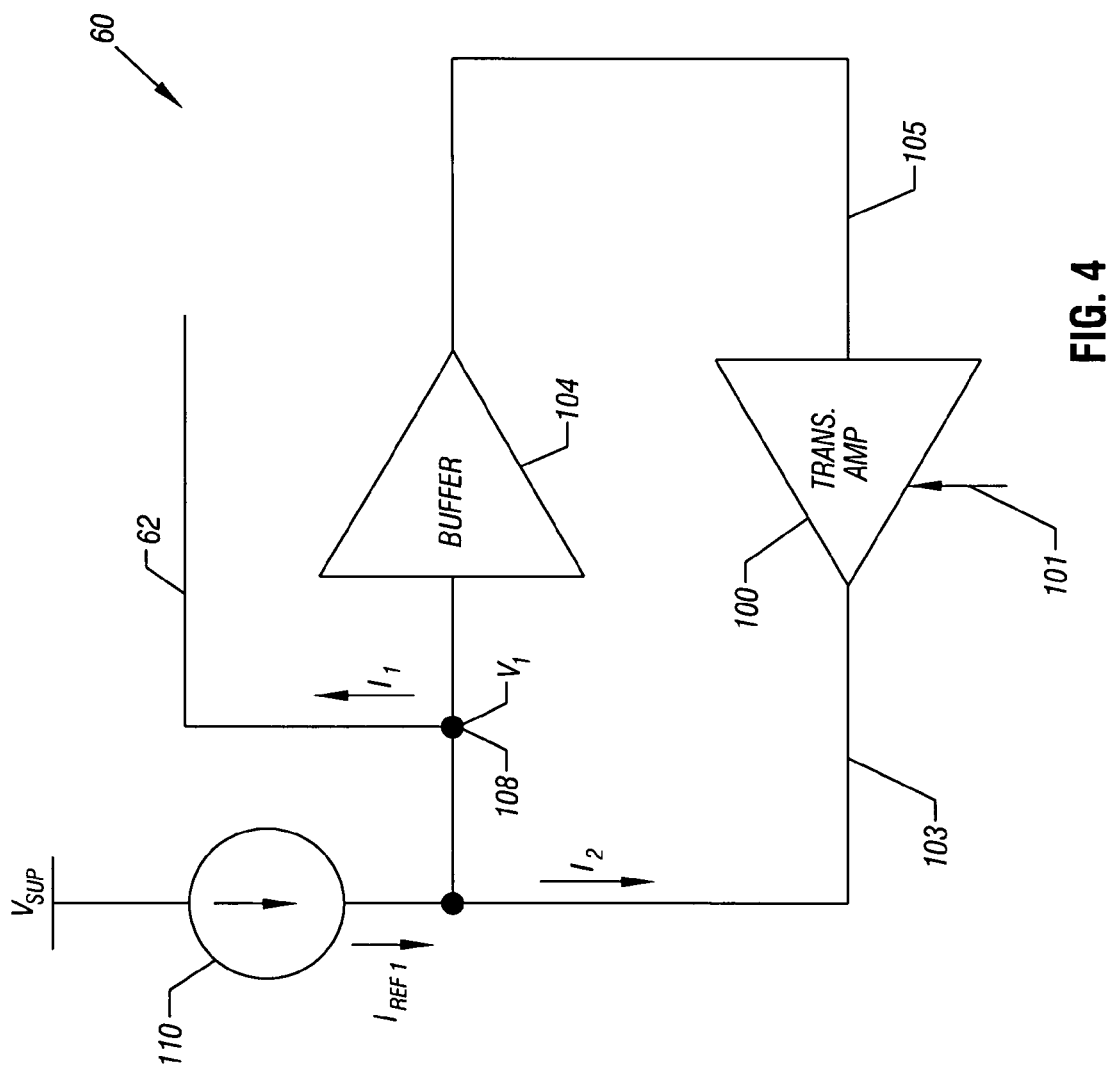
FIG. 4 is a schematic diagram of a closed loop regulator of the step generator of FIG. 3 according to an embodiment of the invention.

Referring to FIG. 4, in some embodiments of the invention, the closed loop regulator 60 may include a transconductance amplifier 100 that sinks an output current (called "$I_2$") at its output terminal 103. The magnitude of the $I_2$ current is proportional to an input voltage that is received at an input terminal 105 of the transconductance amplifier 100, in some embodiments of the invention. The transconductance amplifier 100 also includes control terminals 101 that are used to set an input voltage threshold that defines when charging of the capacitor 70 (to which the closed loop regulator 60 is connected) is complete. As described further below, the input threshold for the transconductance amplifier 100 is a function of the particular capacitor 70 being charged. Thus, the input voltage threshold is higher for the capacitor 70a (that stores the $V_{REF3}$ voltage level), for example, than for the capacitor 70b (that stores the lower $V_{REF2}$ voltage level).

In addition to the transconductance amplifier 100, in accordance with some embodiments of the invention, the closed loop regulator 60 includes a voltage buffer 104. An input terminal of the buffer 104 is coupled to a node 108. The node 108 forms a common point at which the output terminal 62 (of the closed loop regulator 60), the output terminal 103 of the transconductance amplifier 100 and the input terminal of the buffer 104 are coupled together. The node 108 furnishes the $V_1$ voltage. Thus, the buffer 104 provides an indication of the $V_1$ voltage to the input terminal 105 of the transconductance amplifier 100; and as a result the magnitude of the $I_2$ current is proportional to the terminal voltage of the capacitor 70 that is being charged.

A current source 110 is coupled between the $V_{SUP}$ voltage supply line and the node 108 to provide a reference current (called "$I_{REF1}$") to the node 108. Thus, the $I_1$ current is equal to the $I_{REF1}$ current less the $I_2$ current. The $I_{REF1}$ current is equal to the $V_T$ voltage threshold current, in some embodiments of the invention. Therefore, as long as the $I_2$ current is less than the $I_{REF1}$ current, the $I_1$ charging current is supplied to the capacitor 70 being charged. As charging of a particular capacitor 70 progresses, the $I_2$ current increases to correspondingly cause the $I_1$ charging to decrease. Eventually, the $I_2$ current becomes equal to the $I_{REF1}$ current (i.e., the $I_2$ current becomes equal to the $V_T$ voltage threshold current), which causes the $I_1$ charging current to drop to zero and thus, end the charging of the capacitor 70.

As described further below, in some embodiments of the invention, the transconductance amplifier 100 includes reference MLCs that are selectively coupled into the circuitry of the amplifier 100 to establish when the $I_2$ current equals the $I_{REF1}$ current (and thus, control when the charging of the capacitor 70 is complete). When the $I_2$ current couples the $I_{REF1}$ current, then the $V_1$ voltage (and the terminal voltage of the capacitor 70 being charged) is equal to the $V_T$ threshold voltage of the connected reference MLC. More particularly, each reference MLC is associated with one of the capacitors 70 and is selected (to the exclusion of the other reference MLCs) when the associated capacitor 70 is being charged.

Figure 5:
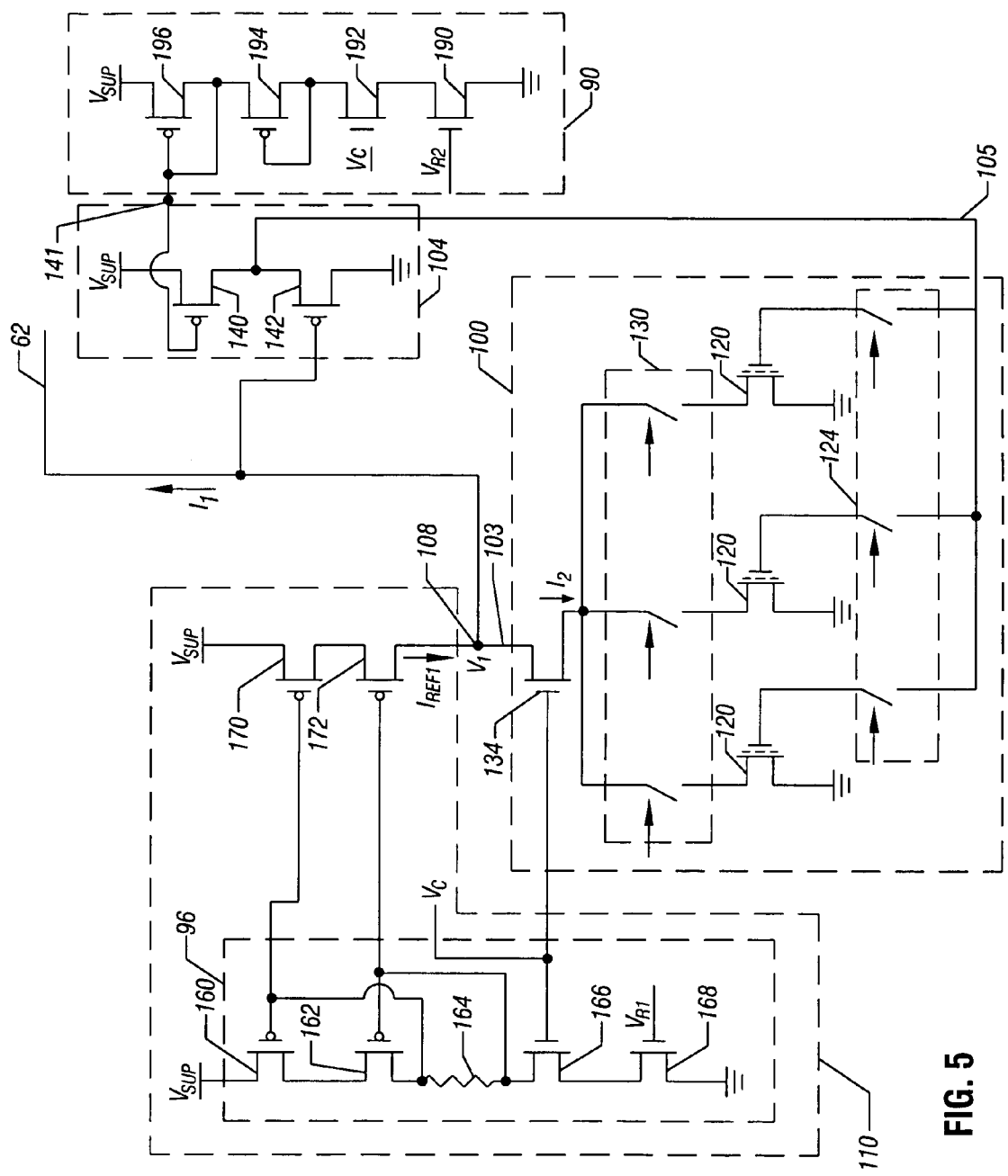
FIG. 5 is a more detailed schematic diagram of a portion of the step generator according to an embodiment of the invention.

Referring to FIG. 5, in some embodiments of the invention, the transconductance amplifier 100 includes three reference MLCs 120 that establish the $V_{REF3}$, $V_{REF2}$ and $V_{REF1}$ voltage levels that are stored on the capacitors 70a, 70b and 70c, respectively. Thus, for example, one of the MLCs 120 is associated with the $V_{REF1}$ voltage; another one of the MLCs 120 is associated with the $V_{REF2}$ voltage; and another one of the MLCs 102 is associated with the $V_{REF3}$ voltage. Only one of the MLCs 120 is coupled (via switches 130) to the output node 108 at a particular time. The gate terminal of the selected MLC 120 is coupled to the input line 105 via an associated switch 124. It is noted that in some embodiments of the invention, the amplifier 100 does not include the switches 124. A switch 130 couples the drain terminal of the selected MLC 120 to the source terminal of an n-channel metal-oxide-semiconductor field-effect-transistor (NMOSFET) 134 that serves as a cascode transistor. The NMOSFET 134 may be biased via a reference voltage (called "$V_C$"), in some embodiments of the invention. The drain terminal of the NMOSFET 134, in turn, is coupled to the node 108.

Referring to FIGS. 3, 4 and 5, in some embodiments of the invention, the current source 110 may be formed from a current mirror that is coupled to the regulator current reference generator 96 (FIG. 3). More specifically, in some embodiments of the invention, this current mirror is formed from p-channel metal-oxide-semiconductor field-effect-transistors (PMOSFETs) 170 and 172 (FIG. 5) and have their source-to-drain paths coupled between the $V_{SUP}$ supply line and the node 108. More particularly, in some embodiments of the invention, the source of the PMOSFET 170 is coupled to the $V_{SUP}$ supply line, and the drain terminal of the PMOSFET 170 is coupled to the source terminal of the PMOSFET 172. The drain terminal of the PMOSFET 172, in turn, is coupled to the node 108. The source-to-gate voltage of the PMOSFET 170 is identical to the source-to-gate voltage of a PMOSFET transistor 160 of the generator 96. Thus, $I_{REF1}$ current that flows through the source-drain-path of the PMOSFET 170 is proportional to the source-to-drain current that flows through the PMOSFET 160. The current may be scaled by varying the relative aspect ratios of the PMOSFETs 160 and 170.

Referring to the more specific details of the current generator 96, the source terminal of the PMOSFET 160 is coupled to the $V_{SUP}$ supply line, and the drain terminal of the PMOSFET 160 is coupled to the source terminal of a PMOSFET 162. The drain terminal of the PMOSFET 162, in turn, is coupled to the gate terminal of the PMOSFET 160; and the gate terminal of the PMOSFET 162 is coupled to the gate terminal of the PMOSFET 172. In some embodiments of the invention, a resistor 164 is coupled between the drain terminal of the PMOSFET 162 and the drain terminal of an NMOSFET 166. The gate terminal of the PMOSFET 162 is also coupled to the drain terminal of the NMOSFET 166. The NMOSFET 166 serves as a cascode transistor and receives the $V_C$ reference voltage in some embodiments of the invention. As depicted in FIG. 5, in some embodiments of the invention, the source terminal of the NMOSFET 166 is coupled to the drain terminal of an NMOSFET 168. The source terminal of the NMOSFET 168, in turn, is coupled to ground. Additionally, the gate terminal of the NMOSFET 168 may receive a reference voltage (called "$V_{R1}$") that establishes the $I_{REF1}$ current from the current source 110. Thus, other embodiments are possible and are within the scope of the appended claims.

It is noted that FIG. 5 depicts one of many possible embodiments for the current source 110. Thus, other embodiments are possible and are within the scope of the appended claims.

Still referring to FIG. 5, in some embodiments of the invention, the buffer 104 may be formed from PMOSFETs 140 and 142 that have their source-to-drain paths coupled between the $V_{SUP}$ supply line and ground. More specifically, in some embodiments of the invention, the source terminal of the PMOSFET 140 is coupled to the $V_{SUP}$ supply line, and the drain terminal of the PMOSFET 140 is coupled to the input terminal 105 of the transconductance amplifier 100. The source terminal of the PMOSFET 142 is also coupled to the input terminal 105; and the drain terminal of the PMOSFET 142 is coupled to ground.

For purposes of establishing a bias current through the buffer 104, in some embodiments of the invention, the gate terminal of the PMOSFET 140 is coupled to the gate terminal of a PMOSFET 196 of the output stage current reference generator 90. Because the source-to-gate voltage of the PMOSFET 140 is the same as the source-to-gate voltage of the PMOSFET 196, the bias current in the buffer 104 is scaled to the current that flows through the source-to-drain path of the PMOSFET 196. The current may be the same if the aspect ratios of the PMOSFETs 140 and 196 are the same. However, current scaling may be employed by varying the aspect ratios of the PMOSFETs 140 and 196.

As shown in FIG. 5, in some embodiments of the invention, the output stage current reference generator 90 includes another PMOSFET 194 that has its source terminal coupled to the drain terminal of the PMOSFET 196. Furthermore, the source and gate terminals of the PMOSFET 196 are coupled together as are the gate and drain terminals of the PMOSFET 194. The drain terminal of the PMOSFET 194 is also coupled to the drain terminal of an NMOSFET 192. The NMOSFET 192 is a cascode transistor that receives the $V_C$ reference voltage at its gate terminal in accordance with some embodiments of the invention. Furthermore, the source terminal of the NMOSFET 192 may be connected to the drain terminal of another NMOSFET 190. The source terminal of the NMOSFET 190 is coupled to ground. As depicted in FIG. 5, the gate terminal of the NMOSFET 190 receives a reference voltage (called "$V_{R2}$") for purposes of establishing the current that flows through the PMOSFET 196 (and thus, may appear in various scaled versions in the buffer 104 as well as the open loop output stages 74).

Figure 6:
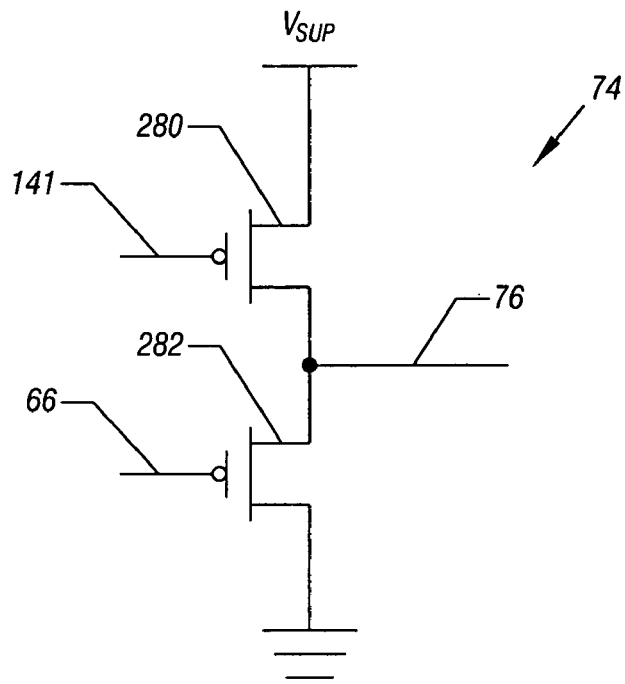
FIGS. 6 and 7 depict open loop output stages of the step generator according to different embodiments of the invention.

Referring to FIG. 6, in some embodiments of the invention, the open loop output stage 74 may be a replica of the buffer 104. More specifically, the open loop output stage 74 may include a PMOSFET 280 that has its source terminal coupled to the $V_{SUP}$ supply line and its drain terminal coupled to the output terminal 76 of the stage 74. The gate terminal of the PMOSFET 280, in turn, may be coupled to the gate terminal 141 of the PMOSFET 196 of the current reference generator 90. Thus, depending on the relative aspect ratios between the PMOSFETs 280 and 196 (see FIG. 5), the bias current of the open loop output stage 74 may be exactly the same or a scaled version of the current established by the generator 90.

In some embodiments of the invention, the open loop output stage 74 also includes a PMOSFET 282 that has its drain terminal coupled to the output terminal 76. The gate terminal of the PMOSFET 282 is coupled to one of the output terminals 66 of the demultiplexer 64; and the source terminal of the PMOSFET 282 is coupled to ground. Thus, in some embodiments of the invention, the open loop output stage 74 is a PMOS driver. However, referring to FIG. 7, in other embodiments of the invention, the open loop output stage 74 that is depicted in FIG. 6 may be replaced by an NMOS driver 300.

Figure 7:
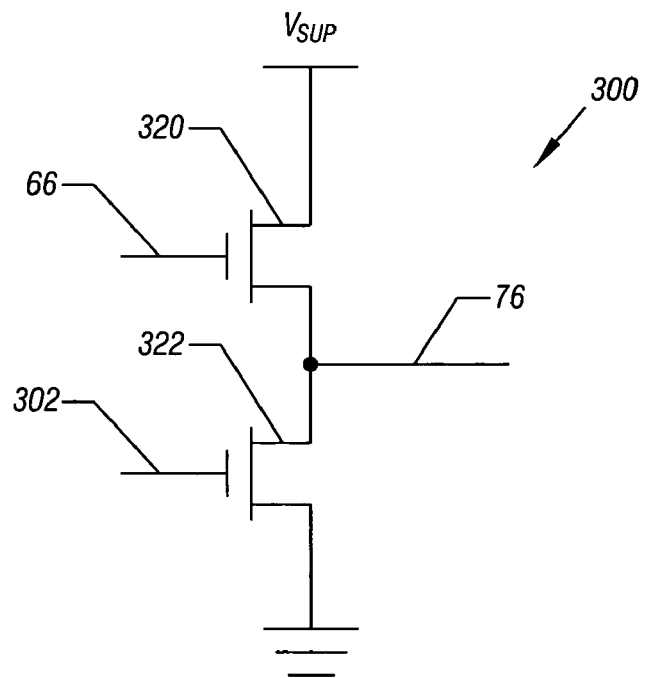

Referring to FIG. 7, more specifically, in accordance with some embodiments of the invention, the NMOS driver 300 includes an NMOSFET 320 that has its drain terminal coupled to the $V_{SUP}$ supply line. The source terminal of the NMOSFET 320, in turn, is coupled to the output terminal 76. The gate terminal of the NMOSFET 320 is coupled to one of the output terminals 66 of the demultiplexer 64. The drain-to-source path of the NMOSFET 320 receives a bias current that is furnished by an NMOSFET 322. More specifically, the drain terminal of the NMOSFET 322 is coupled to the output terminal 76, and the source terminal of the NMOSFET 322 is coupled to ground. A gate terminal 302 of the NMOSFET 322, in turn, is connected to current mirroring transistor of a reference current generator (not shown). Thus, for these embodiments of the invention, the output stage current reference generator 90 may be replaced by a current reference generator that uses an NMOSFET, instead of a PMOSFET, to produce the mirrored current. Therefore, many variations are possible and are within the scope of the appended claims. It is noted that the buffer 104 may be a replica of the NMOS driver 300, for embodiments of the invention in which the NMOS driver 300 is used as the open loop output stage.

Figure 8:
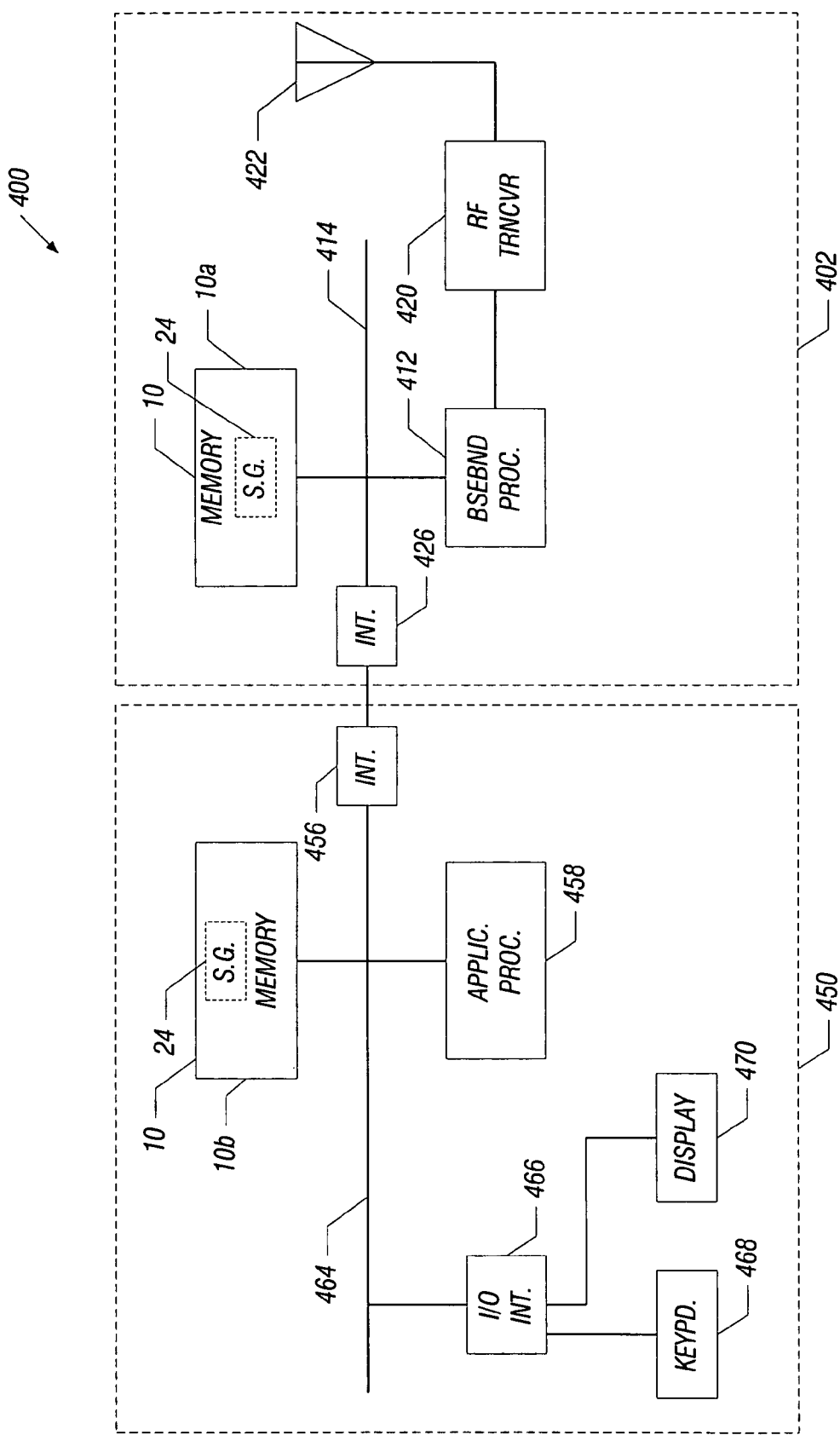
FIG. 8 is a schematic diagram of a wireless system according to an embodiment of the invention.

Referring to FIG. 8, in some embodiments of the invention, the memory 10 may be used in a wireless system 400. For example, the wireless system 400 may include memories 10a and 10b that have the same general design as the memory 10 (FIG. 1). The wireless system 400 may be a personal digital assistant (PDA), notebook computer, cellular telephone, etc., depending on the particular embodiment of the invention. The wireless system 400 includes an application subsystem 450 and a baseband subsystem 402. The baseband subsystem 402 may include, for example, a baseband processor 412 that is coupled to a radio frequency (RF) transceiver 420. The RF transceiver 420 may be coupled to an antenna 422, such as a dipole antenna, for example. The baseband processor 412 demodulates signals that are received from the RF transceiver 420 as well as modulates signals that are provided to the RF transceiver 420.

The baseband processor 412 may be coupled to a bus 414 that is also coupled to a memory 10a. In accordance with some embodiments of the invention, the memory 10a may be an MLC memory, such as a flash memory, for example; and in accordance with some embodiments of the invention, the memory 10a may include the step generator 24. The baseband subsystem 402 may also include an interface 426 that is coupled to the bus 414 for purposes of establishing communication with an interface 456 of the application subsystem 450.

In accordance with some embodiments of the invention, the application subsystem 450 includes an application processor 458 that may, for example, execute instructions that are part of an email, database, organizer or other application function, depending on the particular embodiment of the invention. The application processor 458 may be coupled to a bus 464. The bus 464 permits communication between the application processor 458, the memory 10b and the interface 456. In some embodiments of the invention, the memory 10b may store instructions for the application processor 458 for execution. Furthermore, in accordance with some embodiments of the invention, the memory 10b may be an MLC memory, such as a flash memory. Additionally, in accordance with some embodiments of the invention, the memory 10b may include the step generator 24.

Among the other features of the application subsystem 450, in accordance with some embodiments of the invention, the subsystem 450 includes an input/output (I/O) interface 466 that is coupled to the bus 464. The I/O interface 466 electrically couples various I/O devices to the application subsystem 450, such as a keypad 468 and a display 470, as just a few examples.

It is noted that the wireless system 400 is one out of many possible embodiments of the invention that incorporate one or more memories that include at least one step generator 24. Thus, other wired and wireless systems may use MLC memories and the step generator 24 in accordance with other embodiments of the invention.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A method comprising:
   selectively coupling a regulator to storage elements to store voltages in the storage elements by coupling the regulator to the storage elements one at a time;
   in an operation to read data from a multilevel cell responsive to a time sequence of voltages appearing on a word line, selectively coupling the word line to the storage elements to generate the time sequence of voltages on the word line to cause the multilevel cell to indicate the data;
   using multilevel cells to regulate the storage of the voltages in the storage elements; and
   adjusting an output voltage regulation set point for the regulator based on the storage element connected to the regulator.

2. The method of claim 1, wherein the act of selectively coupling the word line comprises:
   selectively coupling open loop output stages to the word line, each of the open loop output stages being associated with a different one of the storage elements.

3. The method of claim 1, wherein each of the stored voltages are different.

4. The method of claim 1, wherein the regulator comprises an open loop regulator.

5. A memory comprising:
   a multilevel cell;
   a word line coupled to the cell, the multi-level cell being responsive to a time sequence of voltages appearing on the word line;
   storage elements wherein at least one of the storage elements comprises a capacitor;
   a regulator to be selectively coupled to the storage elements to store voltages in the storage elements, the regulator comprising other multilevels cells to regulate the storage of the voltages in the storage elements; and
   a circuit to, in response to a read operation to read data from the multi-level cell, selectively couple the word line to the storage elements to generate the time sequence of voltages on the word line to cause the multi-level cell to indicate the data.

6. The memory of claim 5, wherein the regulator comprises a closed loop regulator.

7. The memory of claim 5, further comprising:
open loop output stages, each open loop output stage being associated with a different one of storage elements.

8. The memory of claim 5, further comprising:
switches to couple the regulator to the storage elements one at a time to store the voltages in the storage elements.

9. The memory of claim 5, wherein the regulator comprises:
switches to selectively couple said other multilevel cells to the storage elements in response to a second time sequence.

10. The memory of claim 9, wherein the regulator comprises:
an output terminal;
a node coupled to the switches and to the output terminal; and
a reference current source to supply a reference current to the node.

11. A system comprising:
a wireless interface; and
a memory coupled to the wireless interface, the memory comprising:
a multilevel cell;
a word line coupled to the cell, the multi-level cell being responsive to a time sequence of voltages appearing on the word line;
storage elements wherein at least one of the storage elements comprises a capacitor;
a regulator to be selectively coupled to the storage elements to store voltages in the storage elements, the regulator comprising other multilevels cells to regulate the storage of the voltages in the storage elements; and
a circuit to, in response to a read operation to read data from the multi-level cell, selectively couple the word line to the storage elements to generate the time sequence of voltages on the word line to cause the multi-level cell to indicate the data.

12. The system of claim 11, wherein the wireless interface comprises a dipole antenna.

13. The system of claim 11, wherein the regulator comprises a closed loop regulator.

14. The system of claim 11, further comprising:
open loop output stages, each open loop output stage being associated with a different one of the storage elements.

* * * * *